US007515430B1

United States Patent
Fredericksen et al.

(10) Patent No.: US 7,515,430 B1
(45) Date of Patent: Apr. 7, 2009

(54) CONDUCTIVE HOOK AND LOOP SHOCKMOUNT SYSTEM

(75) Inventors: Ross T. Fredericksen, Mantorville, MN (US); Edward C. Gillard, Mantorville, MN (US); Don A. Gilliland, Rochester, MN (US); Thomas J. McPhee, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/128,977

(22) Filed: May 29, 2008

(51) Int. Cl.
*H05K 1/14* (2006.01)
(52) U.S. Cl. .................. 361/736; 174/262; 174/264; 174/266; 361/790; 361/792; 361/735; 361/731; 361/732
(58) Field of Classification Search .............. 174/363, 174/377, 368, 255, 262, 264, 266; 361/735, 361/736, 740, 790–792, 794–796, 731; 206/709, 206/701, 706, 707
See application file for complete search history.

(56) References Cited

U.S. PATENT DOCUMENTS

| | | | | |
|---|---|---|---|---|
| 3,585,569 A | * | 6/1971 | Moran | 439/371 |
| 5,136,470 A | * | 8/1992 | Sheridon et al. | 361/749 |
| 5,694,296 A | * | 12/1997 | Urbish et al. | 361/774 |
| 5,774,341 A | * | 6/1998 | Urbish et al. | 361/774 |
| 6,287,126 B1 | * | 9/2001 | Berger et al. | 439/66 |
| 6,607,394 B2 | * | 8/2003 | Lindberg et al. | 439/326 |
| 6,668,380 B2 | | 12/2003 | Marmaropoulos et al. | |
| 6,729,025 B2 | | 5/2004 | Farrell et al. | |
| 7,204,704 B2 | * | 4/2007 | Yamamoto | 439/174 |
| 2003/0029632 A1 | * | 2/2003 | Anthony et al. | 174/250 |
| 2008/0233768 A1 | * | 9/2008 | Joshi et al. | 439/49 |

\* cited by examiner

*Primary Examiner*—Dean A. Reichard
*Assistant Examiner*—Hoa C Nguyen
(74) *Attorney, Agent, or Firm*—Cantor Colburn LLP

(57) ABSTRACT

An electrically conductive shock mount system for electrical subassemblies is provided. The shock mount system includes a first assembly having a housing containing a hook member for a hook and loop fastener. The second assembly has a housing containing a loop member for a hook and loop fastener. A plurality of holes in the housings of the first and second assemblies allows the hook member to engage the loop member. In one embodiment, the housings are made from a conductive fabric and include a plurality of conductive columns that extend through the housings.

1 Claim, 4 Drawing Sheets

CONDUCTIVE HOOK AND LOOP SHOCKMOUNT SYSTEM

BACKGROUND OF THE INVENTION

The present invention relates to a shock mount system for electronic subassembly components, and in particular to a system providing an electrically conductive shock mount that allows for easy installation and removal of the electrical subassembly.

Generally there is a desire to increase the ruggedness of electrical subassemblies, while lowering associated assembly costs and improve overall function. The electrical subassemblies, such as a power supply for example, are typically mounted within housing assemblies, such as a computer rack for example. These electrical subassemblies may be subjected to harsh environmental conditions, such as vibrations caused by surrounding equipment and shocks or high acceleration loads caused by removal and installation of the housing.

Shock mount assemblies are typically used to avoid sudden variations in acceleration by applying the acceleration over a longer period of time. This functionality may be achieved by mounting the assembly on springs or an elastomer. The shock mount assemblies use fasteners, such as a screw or a bolt, to connect to the housing and the subassembly. These fasteners can make installation and removal of the subassembly a difficult and time-consuming process.

Additionally, the electrical subassemblies and the systems in which they are installed have had to meet additional requirements. Increasingly, there has been an increasing demand to reduce radio frequency interference ("RFI") emissions generated by the system. RFI is an electromagnetic interference that may cause problems or disrupt the operations of surrounding equipment. To reduce RFI emissions, manufacturers have typically created an electrical connection between the subassemblies and the housing to ensure that all the subassemblies are operating at the same voltage. This electrical connection was typically achieved using a copper braided cable. However, as systems, such as computer systems, have migrated to higher operating frequencies, the use of a braided cable has been less effective in preventing RFI emissions.

While current electrical subassembly mounting systems and RFI mitigation methods are suitable for their intended purposes, there exists a need for improvements in providing a mounting system that absorbs shock and vibration loads and is electrically conductive. There exists a further need for a mounting system that allows the subassembly to be reliably and repeatedly installed and removed from a main computer system.

BRIEF DESCRIPTION OF THE INVENTION

A shock mount system is provided having a hook housing made of conductive fabric. The hook housing has a first side, a second side and a first generally hollow center portion. The first side further includes a first plurality of openings therein and the second side also includes a second plurality of openings therein. A loop housing is made of conductive fabric. The loop housing has a third side, a fourth side and a second generally hollow center portion. The third side is arranged to be adjacent and in contact with the second side. The third size includes a third plurality of openings and the fourth side has a fourth plurality of openings.

A first plurality of conductive columns is coupled to and arranged perpendicular to the first side and the second side. The conductive columns are made from a conductive fabric. A second plurality of conductive columns is coupled to and arranged perpendicular to the third side and the fourth side. A hook member for a hook and loop fastener is positioned in the first generally hollow center portion. A loop member for a hook and loop fastener is positioned in the second generally hollow center portion.

A first cushion member is positioned between the hook member and the first side. A second cushion member is positioned between the loop member and the second side. A first adhesive layer is coupled to said first side having a fifth plurality of openings, wherein the fifth plurality of openings is aligned with the first plurality of openings. A second adhesive layer is coupled to the fourth side, the second adhesive layer having a sixth plurality of openings, wherein the sixth plurality of openings are aligned with the fourth plurality of openings.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

Figure 1:
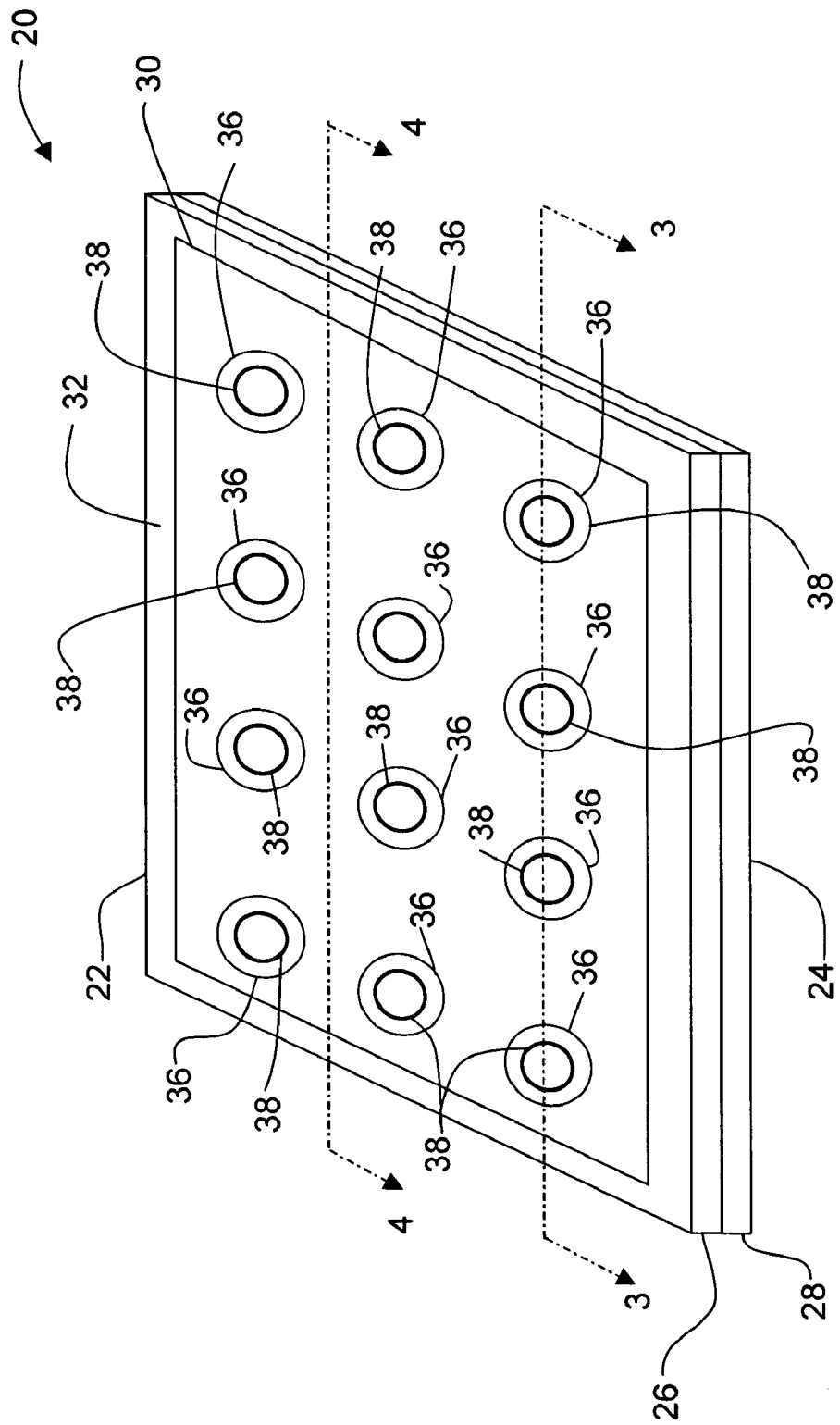
FIG. 1 is a perspective view illustration of an exemplary embodiment shock mount assembly.

The detailed description explains exemplary embodiments, together with advantages and features, by way of example with reference to the drawings.

DETAILED DESCRIPTION

Referring to FIGS. 1-4, an exemplary embodiment electrically conductive shock mount system 20 is illustrated. The shock mount 20 has a hook-side assembly 22 and a loop-side assembly 24. As will be discussed in more detail below, the shock mount 20 includes a hook and loop fastener that allows the shock mount 20 to be repeatably and reliably assembled and disassembled. Each assembly 22, 24 has a housing 26, 28 respectively. In the exemplary embodiment, each housing 26, 28 is made from a conductive fabric. The housings may also be made from any material or combination of materials that allows the housing to be flexible enough to allow assembly and disassembly of a hook and loop fastener while remaining electrically conductive. Conductive fabrics are comprised of a substrate fiber such as cotton, or stainless steel. The substrate fiber may also be a polymer such as polyester or p-phenylene benzobisoxazole (PBO). The fiber substrate may be either coated or embedded with electrically conductive elements, such as but not limited to carbon, nickel, copper, gold, silver, or titanium.

A layer of pressure sensitive adhesive 30 is bonded to the outer surface 32, 34 of each housing 26, 28 respectively. The adhesive layer 30 may be any suitable material capable of being applied in a thin layer and bonding the shock mount 20 in the desired application. The adhesive layer 30 may also be made from a polyimide resin or a polyimide resin combined with an epoxy resin. The adhesive layer 30 may also be an electrically conductive adhesive. In the exemplary embodiment, the adhesive layer 30 is silk-screened onto the outer surfaces 32, 34. The adhesive layer 30 includes a plurality of openings 36. The openings are sized to allow expose the ends of conductive columns 38, 40. In the exemplary embodiment, the adhesive layer is sized to leave a region 59 of the outer surfaces 32, 34 exposed to allow contact with the mating surface when installed and to assist in the transfer of electrical current through the shock mount 20 into the attached electrical component.

Opposite the outer surface 34, each housing 28 further includes an intermediate surface 42. The intermediate surface 42 includes a plurality of openings 44 that extend into a generally hollow interior portion 46 of the housing 28. The openings 44 further expose the loop member 50 of the hook and loop fastener. The loop member 50 is positioned within the interior portion 46. In the exemplary embodiment, the loop member 50 is made from an electrically nonconductive material. A plurality of conductive columns 40 is mounted between the intermediate surface 42 and the outer surface 34. The conductive columns 40 are made from either a conductive fabric, or a conductive polymer. The conductive columns 40 should have sufficient elasticity to move with the surfaces 34, 42 as the shock mount 20 is assembled and disassembled.

The conductive columns 40 may extend through the surface 42 or, alternatively, be coupled to the inside surface of the housing 28. The conductive columns may be attached to the housing by a number of means, such as but not limited to a conductive adhesive or physically attached by a conductive thread that is used to stitch the column to the housing. In the exemplary embodiment, the conductive columns 40 are mounted to the housing 28 in a manner that allows the conductive columns 40 to extend beyond the intermediate surface 42 and the adhesive layer 30. In another embodiment, the columns 40 are formed with the conductive thread.

A cushion member 51 is positioned within the interior portion 46 between the loop member 50 and the outer surface 34. The cushion member 51 assists in damping impact and vibration forces that are transmitted through the shock mount 20. The cushion member 51 may be any suitable material, such as but not limited to an elastomer, closed cell urethane foam, or silicone foam for example. In one embodiment, the cushion member 51 is closed cell foam made from 3 lb-4 lb density commercial grade urethane.

Figure 2:
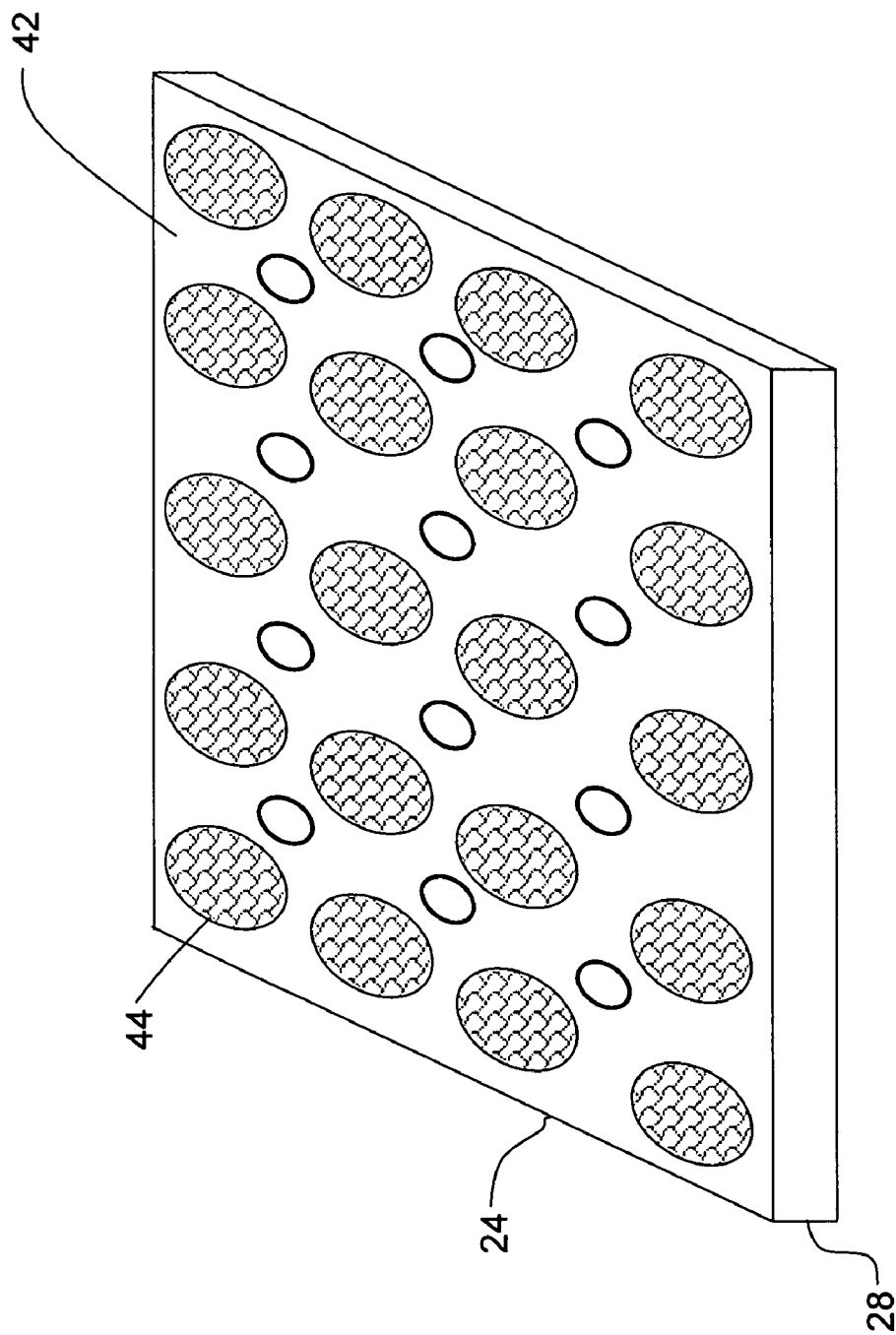
FIG. 2 is a perspective view representation of a loop side of the of the shock mount assembly of FIG. 1.
Figure 3:
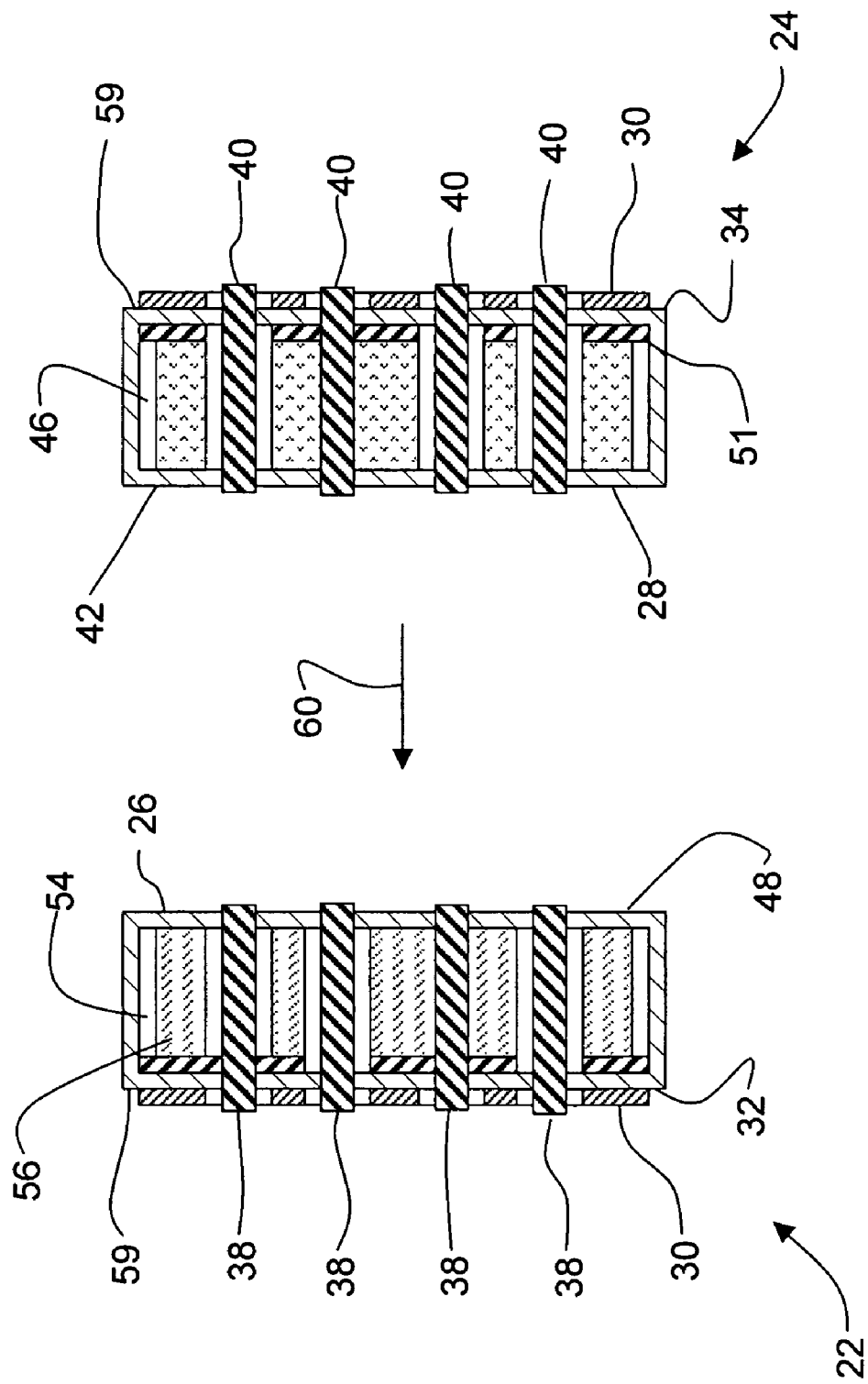
FIG. 3 illustrates a sectional plan view of the shock mount assembly of FIG. 1 cut through the line 3-3; and, FIG. 4 illustrates a sectional plan view of the shock mount assembly of FIG. 1 cut through the line 4-4.
Figure 4:
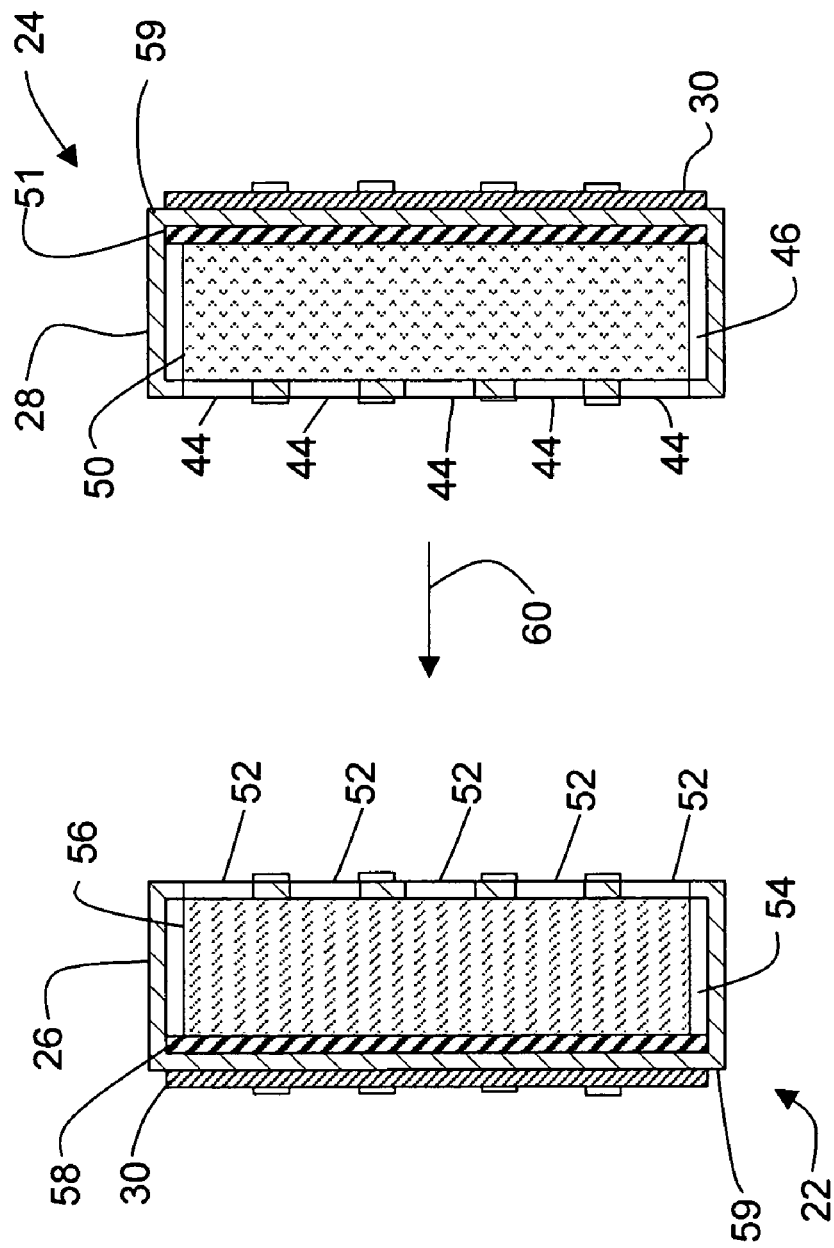

It should be appreciated that while the intermediate surface 42 is described with reference to FIG. 2 and the loop side assembly 24, the hook-side assembly 22 has symmetrical features on an intermediate surface 48 that match and mate with the features of the loop-side assembly 24 when the shock mount 20 is assembled. The hook-side assembly 22 includes openings 52 in surface 48 that expose the hollow interior portion 54 of the housing 26. A hook member 56 is positioned within the interior portion 54. In the exemplary embodiment, the hook member 56 is made from an electrically nonconductive material. The hook member 56 is the hook portion of a hook and loop fastener and is arranged to interlock with loop member 50. In the exemplary embodiment, the hook member 56 and the loop member 50 are positioned to remain below the plane of the intermediate surfaces 42, 48 so that fastener only couples with the housings 26, 28 are pressed forcibly together. Further, in the exemplary embodiment, the hook member 56 and the loop member 50 are made from a nonconductive material.

The conductive columns 38 are coupled to the intermediate surface 48 and extend through the interior portion 54 and are further coupled to the outer surface 32. As discussed above, the conductive columns 38 may be made from a conductive fabric or a conductive polymer. In the exemplary embodiment, the conductive columns 38 are mounted to the housing 26 in a manner that allows the conductive columns 38 to extend beyond the intermediate surface 48 and the adhesive layer 30. Alternatively, as discussed above, the conductive columns 38 may be mounted to the interior surfaces of the housing 26. Another cushion member 58 is positioned between the hook member 56 and the outer surface 32.

To utilize the shock mount 20, the user presses one of the assemblies 22, 24 against the first electrical component in which electrical subassembly will be installed. For example, the first electrical component may be a chassis in a computer rack and the subassembly may be a power supply. By pressing the shock mount assembly, hook-side assembly 22 for example, the pressure sensitive adhesive layer 30 is activated and bonds the hook-side assembly 22 to the desired first electrical component (e.g. computer chassis). Similarly, the other shock mount assembly, loop-side assembly 24 for example, is pressed against the electrical subassembly (e.g. power supply) bonding the loop-side assembly 24 to the electrical subassembly.

To install the electrical subassembly to the first electrical component, the user moves the loop-side assembly 24 in the direction represented by the arrow 60 against the hook-side assembly 22. By pressing the assemblies 22, 24 together, the hook member 56 and the loop member 50 engage in the manner of a hook and loop fastener through the openings 52, 44 respectively. When installed, the shock mount system 20 provides an electrical path from the electrical subassembly to the first electrical component without the use of braided wire or other conductive devices. If the user desires to remove the electrical subassembly, the user pulls on the electrical subassembly causing the hook member 56 and loop member 50 to disengage allowing the separation of the electrical subassembly.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While exemplary embodiments have been described, it will be understood that those skilled in the art, both now and in the future, may make various improvements and enhancements which fall within the scope of the claims which follow. These claims should be construed to maintain the proper protection for the invention first described.

What is claimed is:

1. A shock mount system comprising:
   a hook housing made of conductive fabric, said hook housing having a first side, a second side and a first generally hollow center portion, said first side having a first plurality of openings therein and said second side having a second plurality of openings therein;
   a loop housing made of conductive fabric, said loop housing having a third side, a fourth side and a second generally hollow center portion, wherein said third side is adjacent and in contact with said second side, said third size having a third plurality of openings and said fourth side having a fourth plurality of openings;
   a first plurality of conductive columns coupled to and arranged perpendicular to said first side and said second side, said conductive columns being made from a conductive thread;
   a second plurality of conductive columns coupled to and arranged perpendicular to said third side and said fourth side;

a nonconductive hook member for a hook and loop fastener positioned in said first generally hollow center portion;

a nonconductive loop member for a hook and loop fastener position in said second generally hollow center portion;

a first cushion member positioned between said hook member and said first side;

a second cushion member positioned between said loop member and said second side;

a first adhesive layer coupled to said first side, said first adhesive layer having a fifth plurality of openings, wherein said fifth plurality of openings are aligned with said first plurality of openings; and, a second adhesive layer coupled to said fourth side, said second adhesive layer having a sixth plurality of openings, wherein said sixth plurality of openings are aligned with said fourth plurality of openings.

* * * * *